(12) United States Patent
Lee et al.

(10) Patent No.: US 9,859,431 B2
(45) Date of Patent: Jan. 2, 2018

(54) METHOD OF FORMING A SEMICONDUCTOR DEVICE WITH MULTIPLE ETCH STOP LAYERS AND INTER-LAYER DIELECTRICS

(71) Applicant: Taiwan Semiconductor Manufacturing Company, Ltd., Hsin-Chu (TW)

(72) Inventors: Tung Ying Lee, Hsin-Chu (TW); Yu-Lien Huang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/067,984

(22) Filed: Mar. 11, 2016

(65) Prior Publication Data
US 2016/0197175 A1 Jul. 7, 2016

Related U.S. Application Data

(62) Division of application No. 13/841,311, filed on Mar. 15, 2013, now Pat. No. 9,293,585.

(Continued)

(51) Int. Cl.
| | |
|---|---|
| *H01L 21/02* | (2006.01) |
| *H01L 29/78* | (2006.01) |
| *H01L 29/49* | (2006.01) |
| *H01L 29/66* | (2006.01) |
| *H01L 21/3105* | (2006.01) |
| *H01L 29/40* | (2006.01) |

(52) U.S. Cl.
CPC ........ *H01L 29/785* (2013.01); *H01L 21/0214* (2013.01); *H01L 21/0217* (2013.01); *H01L 21/0228* (2013.01); *H01L 21/02167* (2013.01); *H01L 21/02274* (2013.01); *H01L 21/02282* (2013.01); *H01L 21/31051* (2013.01); *H01L 29/401* (2013.01); *H01L 29/4983* (2013.01); *H01L 29/6656* (2013.01); *H01L 29/66545* (2013.01); *H01L 29/66795* (2013.01)

(58) Field of Classification Search
CPC ........... H01L 21/0214; H01L 21/02167; H01L 21/0217; H01L 21/02274; H01L 21/0228; H01L 21/02282; H01L 21/31051; H01L 29/401; H01L 29/4983; H01L 29/66545; H01L 29/6656
USPC ......... 257/288, 368, 369; 438/151, 197, 199
See application file for complete search history.

(56) References Cited

U.S. PATENT DOCUMENTS

| | | | |
|---|---|---|---|
| 8,367,493 B1* | 2/2013 | Ngo | H01L 23/291 257/315 |
| 2006/0189051 A1 | 8/2006 | Kim | |

(Continued)

FOREIGN PATENT DOCUMENTS

CN 102347361 A 2/2012

*Primary Examiner* — Shahed Ahmed
(74) *Attorney, Agent, or Firm* — Slater Matsil, LLP (57) ABSTRACT

An embodiment is a semiconductor device comprising a first gate structure over a semiconductor substrate, a first etch stop layer (ESL) over the semiconductor substrate and the first gate, the first ESL having a curved top surface, and a first inter-layer dielectric (ILD) on the first ESL, the first ILD having a curved top surface. The semiconductor device further comprises a second ESL on the first ILD, the second ESL having a curved top surface, and a second ILD on the second ESL.

20 Claims, 8 Drawing Sheets

Related U.S. Application Data (60) Provisional application No. 61/776,722, filed on Mar. 11, 2013.

(56) References Cited

U.S. PATENT DOCUMENTS

| | | |
|---|---|---|
| 2007/0166984 A1 | 7/2007 | Kim |
| 2010/0117158 A1 | 5/2010 | Koide |
| 2011/0256682 A1* | 10/2011 | Yu .................. H01L 21/02181 438/287 |
| 2012/0032238 A1 | 2/2012 | Teo et al. |
| 2013/0175587 A1 | 7/2013 | Ramachandran et al. |
| 2014/0120710 A1 | 5/2014 | Shin et al. |

* cited by examiner

METHOD OF FORMING A SEMICONDUCTOR DEVICE WITH MULTIPLE ETCH STOP LAYERS AND INTER-LAYER DIELECTRICS

This application is a divisional of U.S. patent application Ser. No. 13/841,311, entitled "Semiconductor Device Structure and Method of Forming Same," filed on Mar. 15, 2013, which claims the benefit of U.S. Provisional Application No. 61/776,722, filed on Mar. 11, 2013, entitled "Semiconductor Device Structure and Method of Forming Same," which applications are hereby incorporated herein by reference.

BACKGROUND

The cost and complexity associated with scaling of semiconductor device sizes according to Moore's law has given rise to new methods to improve semiconductor device characteristics. New gate materials such as Hi-K metal gates to decrease device leakage, FinFET devices with increased effective gate area as compared to same-size planar devices, and strain inducing channels for increased charge carrier mobility are a few examples of methods to continue Moore's Law scaling for next generation microprocessor designs.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a semiconductor device with a second etch stop layer over and between gate structures to prevent extra loss of layers beneath the second etch stop layer. Other embodiments may also be applied, however, to other semiconductor devices with a high-aspect ratio processes between conductive structures.

Figure 1:
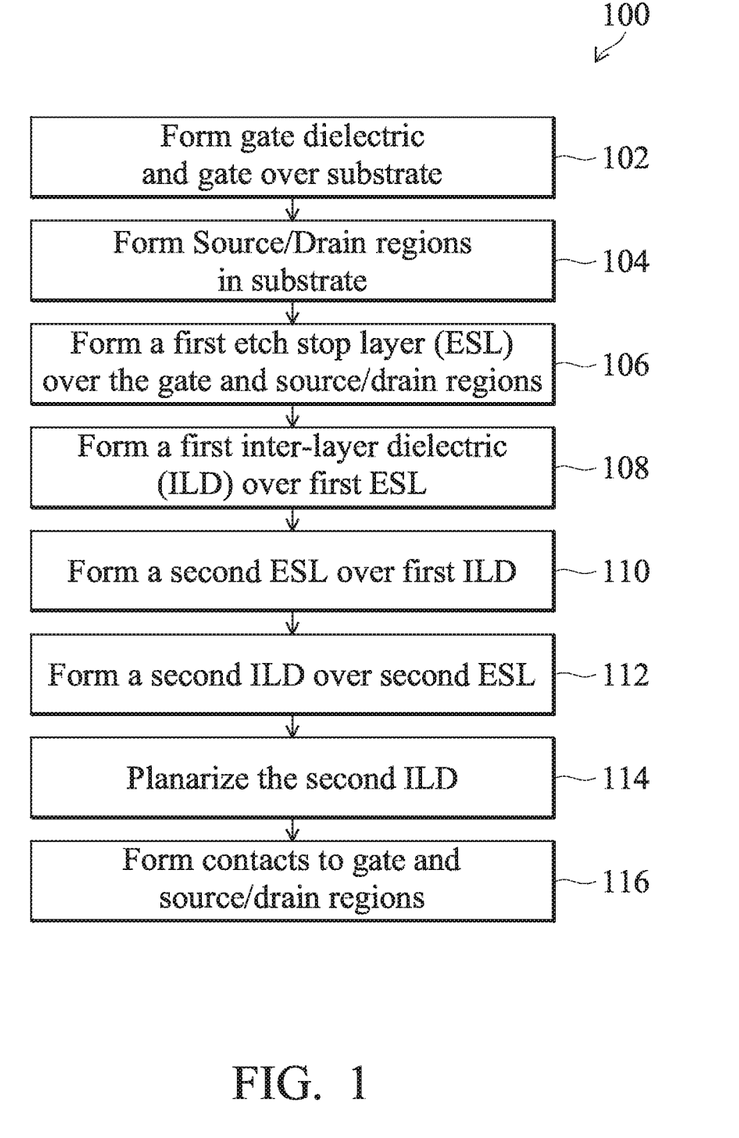
FIG. 1 illustrates a flow diagram of a method for manufacturing a gate-first semiconductor device according to an embodiment.

FIG. 1 illustrates a flow diagram of a method 100 for forming a gate-first semiconductor device according to an embodiment. While method 100 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The steps of method 100 will be described with reference to FIG. 2 as an example although the method 100 may apply to the other embodiments in FIGS. 3, 4, and 6-8.

Figure 2:
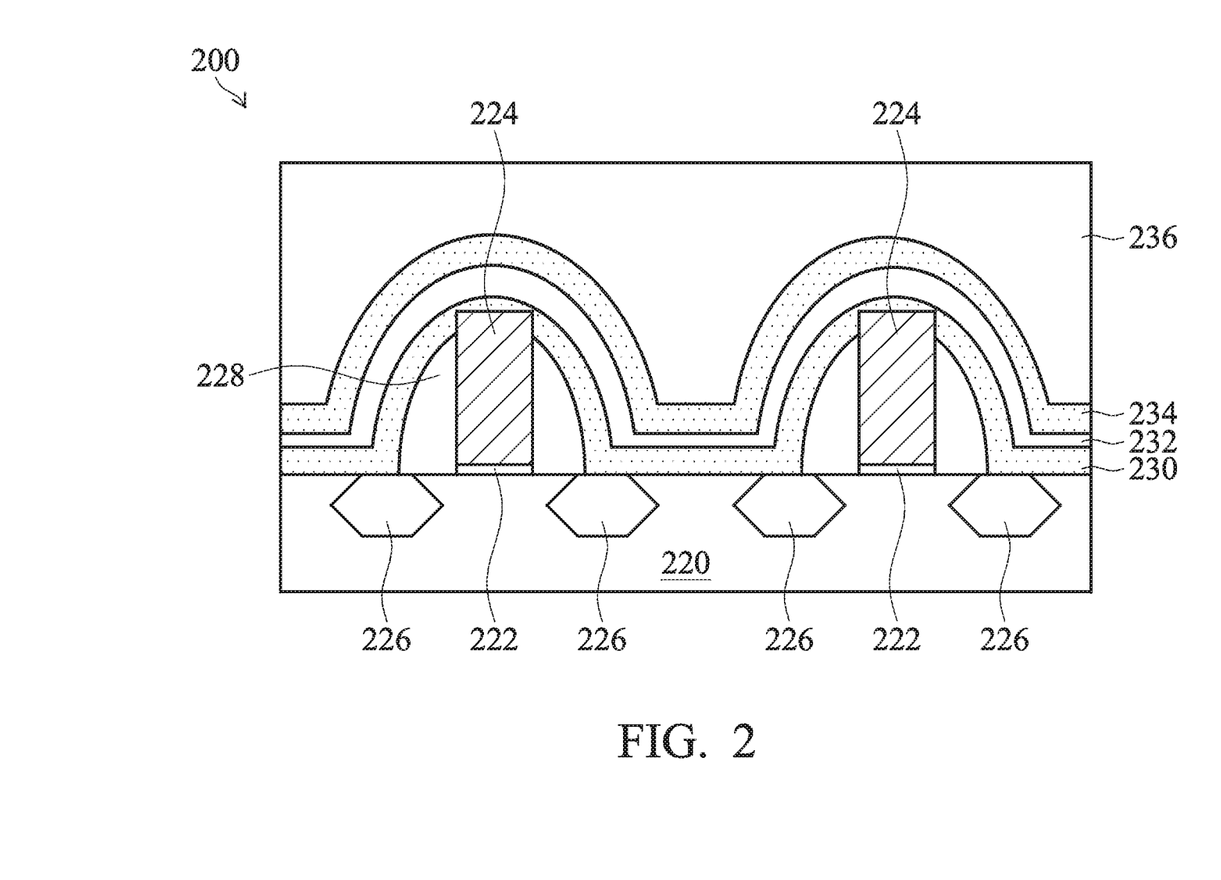
FIG. 2 illustrates a gate-first semiconductor device according to an embodiment.

FIG. 2 illustrates a cross-sectional view of a semiconductor device 200. The semiconductor device 200 includes source/drain regions 226 in a semiconductor substrate 220, gates 224 over a gate dielectric 222, the gates 224 and the gate dielectric 222 laterally between the source/drain regions 226, and gate spacers 228 on opposite sides of the gates 224. The semiconductor device further includes a first etch stop layer (ESL) 230 over the components on semiconductor substrate 220, a first inter-layer dielectric (ILD) 232 on the first ESL 230, a second etch stop layer 234 on the first ILD 232, and a second ILD 236 on the second ESL 234.

The semiconductor substrate 220 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The semiconductor substrate 220 may be doped through an implantation process to introduce p-type or n-type impurities into the semiconductor substrate 220. In an embodiment, wherein the semiconductor device 200 is a FinFET device, fins may be patterned and doped similar to the semiconductor substrate as described above.

The semiconductor substrate 220 may include active devices (not shown in FIG. 2). As one of ordinary skill in the art will recognize, a wide variety of devices such as transistors, capacitors, resistors, combinations of these, and the like may be used to generate the structural and functional requirements of the design for the semiconductor device 200. The devices may be formed using any suitable methods.

Only a portion of the semiconductor substrate 220 is illustrated in the figures, as this is sufficient to fully describe the illustrative embodiments.

At step 102, a gate dielectric layer, a gate, and gate spacers are formed over a substrate. The gate dielectric layer 222 may be formed over the semiconductor substrate 220 by thermal oxidation, chemical vapor deposition (CVD), sputtering, or any other methods known and used in the art for forming a gate dielectric. In other embodiments, the gate dielectric layer 222 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer (not shown) may be formed over the gate dielectric layer 222. The gate electrode layer may comprise a conductive material and may be selected from a group comprising polycrystalline-silicon (poly-Si), polycrystalline silicon-germanium (poly-SiGe), metallic nitrides, metallic silicides, metallic oxides, and metals. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer may be patterned to form the gate 224. The gate patterning process may be accomplished by depositing mask material (not shown) such as photoresist or silicon oxide over the gate electrode layer. The mask material is then patterned and the gate electrode layer is etched in accordance with the pattern. In an embodiment, the gate 224 may be formed to a height between about 30 nm and about 100 nm.

At step 104, source/drain regions may be formed in the substrate. The source/drain regions 226 may be doped by performing implanting process to implant appropriate dopants to complement the dopants in the semiconductor substrate 220. In another embodiment, the source/drain regions 226 may be formed by forming recesses (not shown) in the semiconductor substrate 220 and epitaxially growing material in the recesses. The source/drain regions 226 may be doped either through an implantation method as discussed above, or else by in-situ doping as the material is grown.

In an embodiment the semiconductor device 200 may be configured in a PMOS or an NMOS configuration. In a PMOS configuration, the semiconductor substrate 220 may be doped with n-type dopants and the source/drain regions 226 may be doped with p-type dopants. In an NMOS configuration, the semiconductor substrate 220 may be doped with p-type dopants, and the source/drain regions 226 may be doped with n-type dopants. As discussed above, the doping may be performed either through an implantation method, or else by in-situ doping as the material is epitaxially grown Gate spacers 228 may be formed on opposite sides of the gate 224. The gate spacers 228 are typically formed by blanket depositing a spacer layer (not shown) on the previously formed structure. In an embodiment, the gate spacers 228 may include a spacer liner (not shown) comprising SiN, SiC, SiGe, oxynitride, oxide, combinations thereof, or the like. The spacer layer may comprise SiN, oxynitride, SiC, SiON, $Si_xC_yN_z$, oxide, combinations thereof, or the like and may be formed by methods utilized to form such a layer, such as CVD, plasma enhanced CVD, sputter, and other methods known in the art. The gate spacers 228 are then patterned, for example, by anisotropically etching to remove the spacer layer from the horizontal surfaces of the structure.

In another embodiment, the source/drain regions 226 may comprise a lightly doped region and a heavily doped region. In this embodiment, before the gate spacers 228 are formed, the source/drain regions 226 may be lightly doped. After the gate spacers 228 are formed, the source/drain regions 226 may then be heavily doped. This forms lightly doped regions and heavily doped regions. The lightly doped regions are primarily underneath the gate spacers 228 while the heavily doped regions are outside of the gate spacers 228 along the semiconductor substrate 220.

At step 106, a first ESL may be formed over the substrate, the source/drain regions, and the gates and gate spacers. As illustrated in FIG. 2, the first ESL 230 may be formed over the semiconductor substrate 220, the source/drain regions 226, the gates 224, and the gate spacers 228. The first ESL 230 may be conformally deposited over components on the semiconductor substrate 220. In an embodiment, the first ESL 230 may comprise SiN, SiCN, SiON, the like, or a combination thereof and may be formed by atomic layer deposition (ALD), molecular layer deposition (MLD), a furnace process, CVD, plasma-enhanced CVD (PECVD), plasma-enhanced silicon nitride (PESiN), the like, or a combination thereof. In an embodiment, the first ESL 230 may be formed to have a thickness from about 3 nm to about 30 nm.

At step 108, a first ILD is formed over the first ESL. As illustrated in FIG. 2, the first ILD 232 may be formed over the first ESL 230. The first ILD 232 may be conformally deposited over the first ESL 230. In an embodiment, the first ILD 232 may comprise $SiO_2$, SiON, the like, or a combination thereof. The first ILD 232 may be formed by CVD, ALD, PECVD, subatmospheric CVD (SACVD), flowable CVD, a high density plasma (HDP), a spin-on-dielectric process, the like, or a combination thereof. In an embodiment, the first ILD 232 may be formed to have a thickness from about 3 nm to about 70 nm.

At step 110, a second ESL is formed over the first ILD As illustrated in FIG. 2, the second ESL 234 may be formed over the first ILD 232. The second ESL 234 may be conformally deposited over the first ILD 232 and may provide protection to the first ILD 232 during subsequent etching and planarization processes. In an embodiment, the second ESL 234 may comprise SiN, SiCN, SiON, the like, or a combination thereof and may be formed by ALD, MLD, PECVD, PESiN, a furnace process, CVD, the like, or a combination thereof. In an embodiment, the second ESL 234 may be formed to have a thickness from about 10 nm to about 1000 nm.

At step 112, a second ILD is formed over the second ESL layer. As illustrated in FIG. 2, the second ILD 236 may be formed over the second ESL 234. In an embodiment, the second ILD 236 may comprise $SiO_2$, SiON, the like, or a combination thereof. The second ILD 236 may be formed by CVD, ALD, PECVD, SACVD, flowable CVD, an HDP, a spin-on-dielectric process, the like, or a combination thereof.

At step 114, the second ILD may be planarized. The second ILD 236 may be planarized to provide a planar top surface on the second ILD 236 to form, attach, or mount other devices and structures. In an embodiment, the second ILD 236 is planarized by using a CMP to remove portions of the second ILD 236. In other embodiments, other planarization techniques may be used, such as etching.

At step 116, contacts may be formed to the gates and source/drain regions. Although not shown in FIG. 2, contacts may be formed to allow external connections to the gates 224 and the source/drain regions 226 by devices and structures on or above the second ILD 236. Openings may be etched through the second ILD 236, the second ESL 234, the first ILD 232, and the first ESL 230 to the source/drain regions 226 and the gates 224. The openings can be etched using acceptable photolithography techniques, such a single or dual damascene process. It should be noted that acceptable photolithography techniques may use a first etchant to etch through the second ILD 236 and a second etchant to etch through the second ESL 234 and further etchants to etch through the first ILD and ESL 232 and 230.

Source/drain contacts and gate contacts (not shown) may then be formed in the openings. Forming the source/drain contacts and gate contacts may include, for example, depositing a barrier layer such as titanium nitride, tantalum nitride, the like, or a combination thereof, and then depositing a conductive material, such as a metal like aluminum, copper, tungsten, the like, or a combination thereof, in the openings. The deposition may be by, for example, CVD, ALD, physical vapor deposition (PVD), the like, or a combination thereof. Excess barrier layer materials and/or conductive materials are removed, such as by CMP.

Although FIG. 2 illustrates an embodiment with two ESL layers (230 and 234) and two ILD layers (232 and 236), another embodiment may have more than two ESL layers and more than two ILD layers. As an example, an embodiment may have three ESL layers and three ILD layers.

It has been found that having a second ESL 234 over the first ILD 232 may prevent recessing of the first ILD 232 between the gates 224. These recesses in the first ILD 232 may allow metal residue from subsequent processing to form between the gates 224 and cause a gate-to-gate bridge. The second ESL 234 prevents these recesses in the first ILD 232 between the gates 224, and thus, may prevent the gate-to-gate bridge. Further, the prevention of metal residue in the first IDL 232 recesses prevents the necessity of over polishing to remove the metal residue which may cause a shortened gate height.

Figure 3:
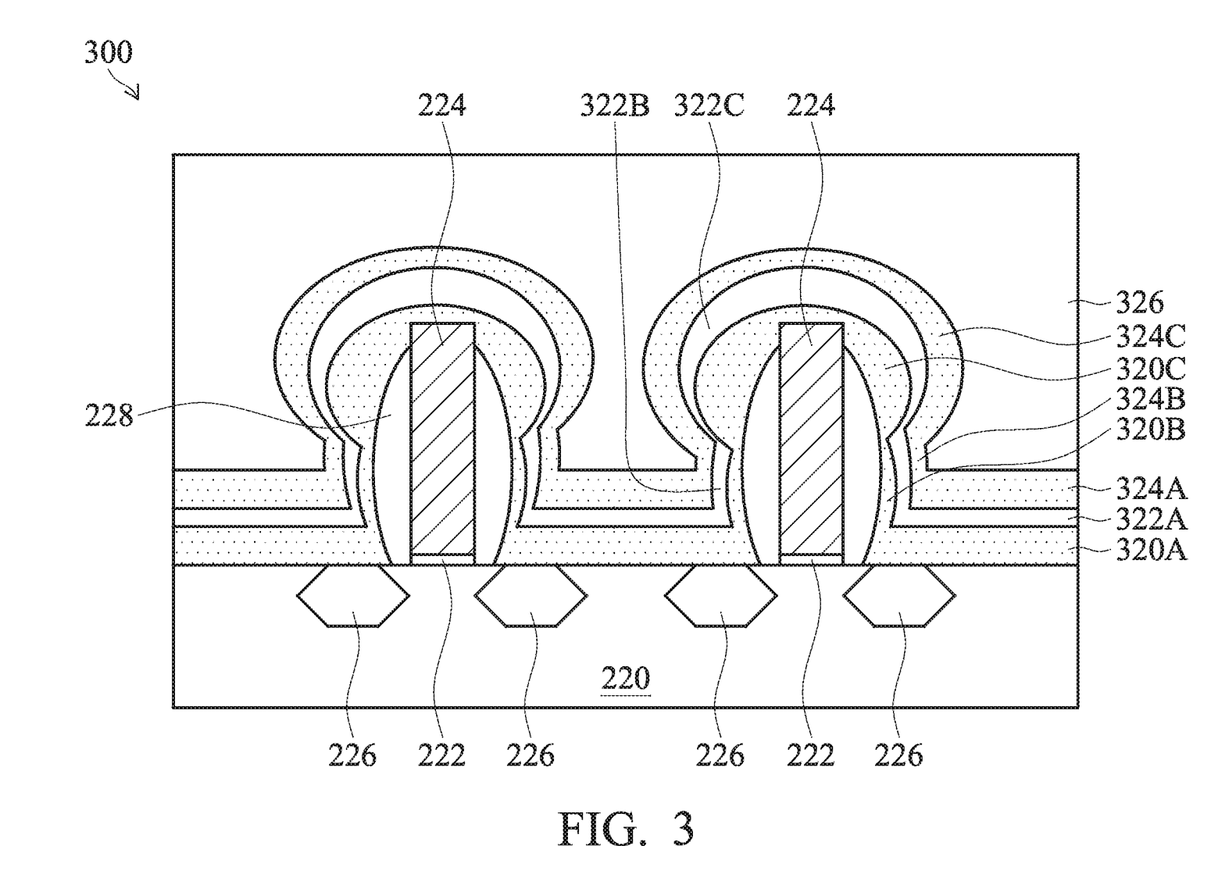
FIG. 3 illustrates a gate-first semiconductor device according to another embodiment.

FIG. 3 illustrates another embodiment of a gate-first semiconductor device 300 wherein the ESLs and the ILDs are formed non-conformally. For example, a first ESL 320 comprises a first portion 320A on the semiconductor substrate 220 having a top surface substantially parallel with a top surface of the semiconductor substrate 220, a second portion 320B on the sidewalls of the gate spacers 228, and a third portion 320C on an upper portion of the gate spacers 228 and gates 224. A first ILD 322, a second ESL 324, and a second ILD 326 may also comprise three portions each in similar configurations as discussed below. Details regarding this embodiment that are similar to those for the previously described embodiment will not be repeated herein.

The first ESL 320 may be formed over the semiconductor substrate 220, the source/drain regions 226, the gates 224, and the gate spacers 228. The first ESL 230 may be non-conformally deposited over components on the semiconductor substrate 220. In an embodiment, the first ESL 320 may comprise SiN, SiCN, SiON, the like, or a combination thereof and may be formed by PECVD, PESiN, low-pressure CVD (LPCVD), the like, or a combination thereof. The first ESL 320 may comprise a first portion 320A having a substantially planar top surface which is substantially parallel with a top surface of the semiconductor substrate 220, a second portion 320B on the sidewalls of the gate spacers 228 having a top surface substantially parallel with the sidewalls of the gate spacers 228, and a third portion 320C on an upper portion of the gate spacers 228 and gates 224 having a substantially curved top surface. In an embodiment, the first portion 320A may be formed to have a thickness between about 3 nm and about 10 nm, the second portion 320B may be formed to have a thickness between about 3 nm and about 30 nm, and the third portion 320C may be formed to have a thickness between about 3 nm and about 30 nm.

The first ILD 322 may be formed over the first ESL 320. The first ILD 322 may be non-conformally deposited over the first ESL 320. In an embodiment, the first ILD 322 may comprise $SiO_2$, SiON, the like, or a combination thereof and may be formed by PECVD, SACVD, flowable CVD, a spin-on-dielectric process, the like, or a combination thereof. The first ILD 322 may comprise a first portion 322A having a substantially planar top surface which is substantially parallel with a top surface of semiconductor substrate 220, a second portion 322B on the second portion 320B of the first ESL 320 having a top surface substantially parallel with the sidewalls of the gate spacers 228, and a third portion 322C on the third portion 320C of the first ESL 320 having a substantially curved top surface. In an embodiment, the first portion 322A may be formed to have a thickness between about 3 nm and about 30 nm, the second portion 322B may be formed to have a thickness between about 1 nm and about 30 nm, and the third portion 322C may be formed to have a thickness between about 1 nm and about 30 nm.

The second ESL 324 may be formed over the first ILD 322. The second ESL 324 may be non-conformally deposited over the first ILD 322 and may provide protection to the first ILD 322 during subsequent etching and planarization processes. In an embodiment, the second ESL 324 may comprise SiN, SiCN, SiON, the like, or a combination thereof and may be formed by PECVD, PESiN, ALD, MLD, LPCVD, SACVD, the like, or a combination thereof. The second ESL 324 may comprise a first portion 324A having a substantially planar top surface which is substantially parallel with a top surface of the semiconductor substrate 220, a second portion 324B on the second portion 322B of the first IDL 322 having a top surface substantially parallel with the sidewalls of the gate spacers 228, and a third portion 324C on the third portion 322C of the first ILD 322 having a substantially curved top surface. In an embodiment, the first portion 324A may be formed to have a thickness between about 3 nm and about 30 nm, the second portion 324B may be formed to have a thickness between about 3 nm and about 30 nm, and the third portion 324C may be formed to have a thickness between about 3 nm and about 30 nm.

The second ILD 326 may be formed over the second ESL 324. In an embodiment, the second ILD 326 may comprise $SiO_2$, SiON, the like, or a combination thereof. The second ILD 326 may be formed by CVD, ALD, PECVD, SACVD, flowable CVD, an HDP, a spin-on-dielectric process, the like, or a combination thereof.

Figure 4:
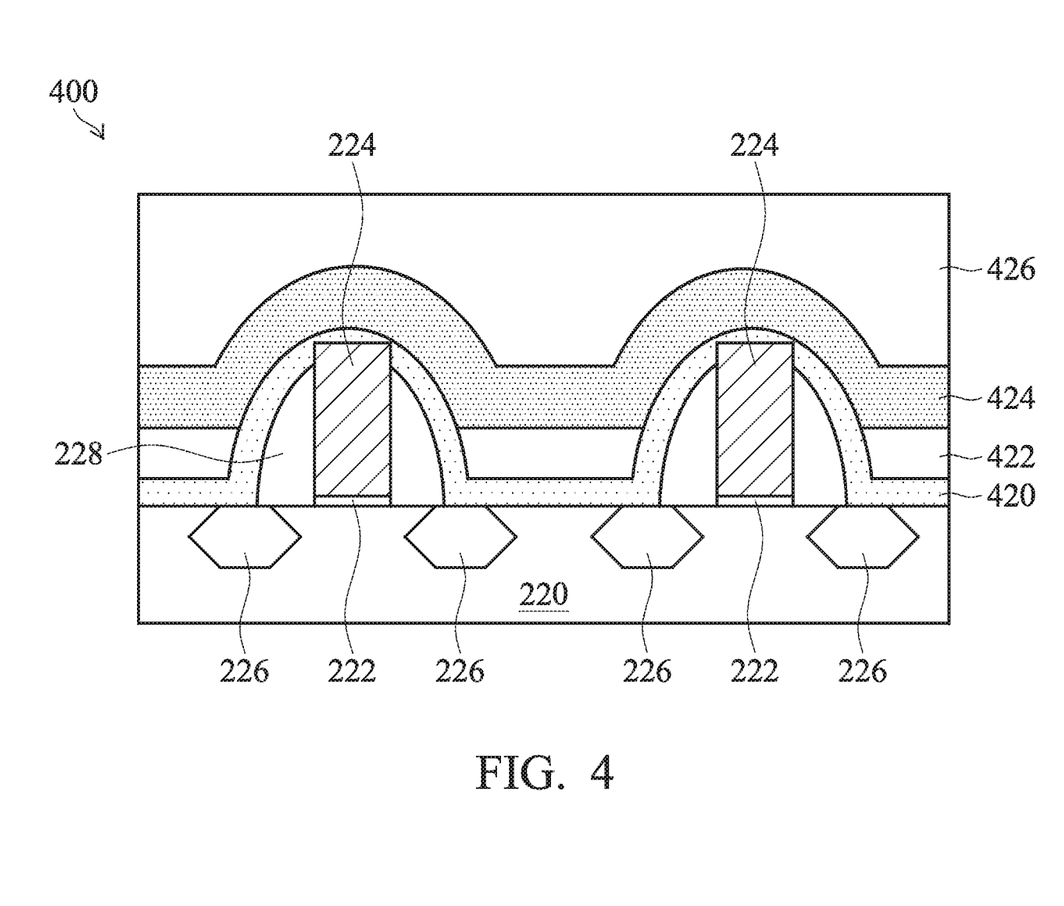
FIG. 4 illustrates a gate-first semiconductor device according to yet another embodiment.

FIG. 4 illustrates another embodiment of a gate-first semiconductor device 400 wherein the first ILD may be formed to have top surfaces which are substantially parallel with the top surface of the semiconductor substrate 220 and wherein the first ILD is not over the gate spacers 228 and the gates 224. Details regarding this embodiment that are similar to those for the previously described embodiment will not be repeated herein.

A first ESL 420 may be formed over the semiconductor substrate 220 and the source/drain regions 226. The first ESL 420 may be conformally deposited over components on the semiconductor substrate 220. In an embodiment, the first ESL 420 may comprise SiN, SiCN, SiON, the like, or a combination thereof and may be formed by ALD, MLD, PECVD, PESiN, a furnace process, CVD, the like, or a combination thereof. In an embodiment, the first ESL 420 may be formed to have a thickness between about 3 nm and about 30 nm.

A first ILD 422 may be formed over the first ESL 420. The first ILD 422 may be formed to have a substantially uniform thickness and a top surface substantially parallel with a top surface of the semiconductor substrate 220. In an embodiment, substantially the entire top surface of the first ILD 422 is substantially parallel with the top surface of the semiconductor substrate 220. In an embodiment, the first ILD 422 may comprise $SiO_2$, SiON, the like, or a combination thereof and may be formed by a flowable CVD process, a spin-on-dielectric process, the like, or a combination thereof. In an embodiment, the first ILD 422 may be formed to have a thickness between about 3nm and about 30 nm.

The second ESL 424 may be conformally deposited over the first ILD 422 and may provide protection to the first ILD 422 during subsequent etching and planarization processes. In an embodiment, the second ESL 424 may comprise SiN, SiCN, SiON, the like, or a combination thereof and may be formed by ALD, MLD, PECVD, PESiN, a furnace process, CVD, the like, or a combination thereof. In an embodiment, the second ESL 234 may be formed to have a thickness between about 3 nm and about 30 nm.

The second ILD 426 may be formed over the second ESL 424. In an embodiment, the second ILD 426 may comprise $SiO_2$, SiON, the like, or a combination thereof. The second ILD 326 may be formed by CVD, ALD, PECVD, SACVD, flowable CVD, an HDP, a spin-on-dielectric process, the like, or a combination thereof.

Figure 5:
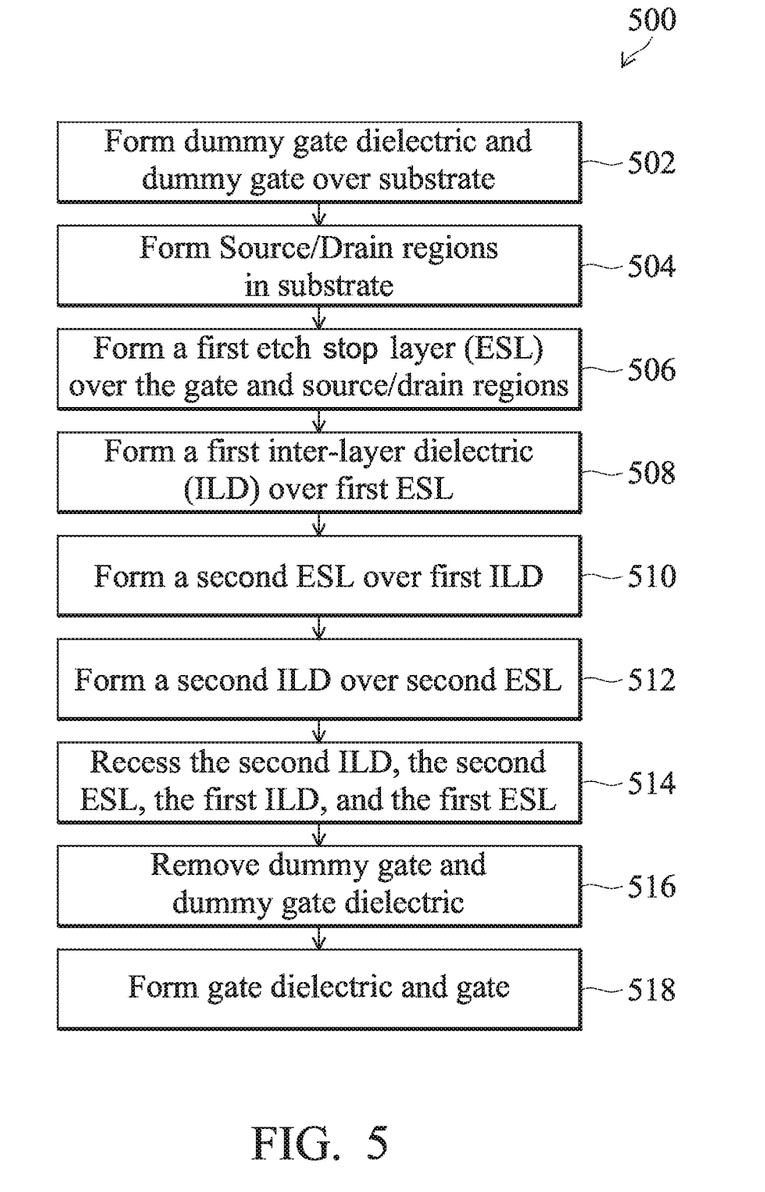
FIG. 5 illustrates a flow diagram of a method for manufacturing a gate-last semiconductor device according to an embodiment.

FIG. 5 illustrates a flow diagram of a method 500 for forming a gate-last (also referred to as replacement gate) semiconductor device according to an embodiment. While method 500 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The steps of method 500 will be described with reference to FIG. 6 as an example although the method 500 may apply to the other embodiments in FIGS. 2-4, 7, and 8.

Figure 6:
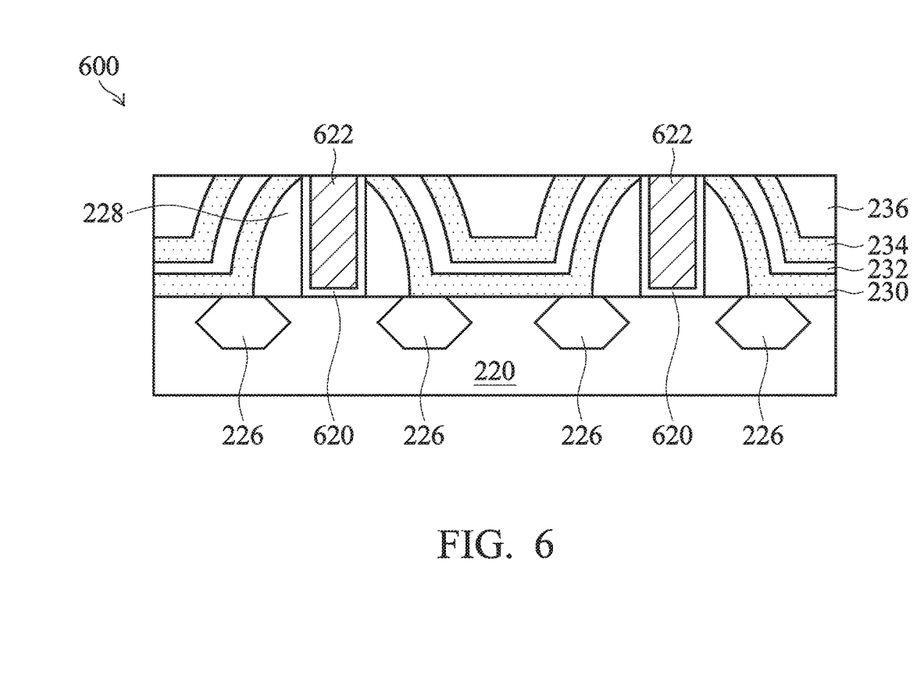
FIG. 6 illustrates a gate-last semiconductor device according to an embodiment.

FIG. 6 illustrates a gate-last semiconductor device 600 with a conformal first ESL 230, a conformal first ILD 232, a conformal second ESL 234, and a second ILD 236. The semiconductor device 600 is similar to semiconductor device 200 in FIG. 2 except for the semiconductor device 600 is formed in a gate-last process rather than the gate-first process of semiconductor device 200. Details regarding this embodiment that are similar to those for the previously described embodiment will not be repeated herein.

At step 502, a dummy gate dielectric and a dummy gate are formed over a substrate. Step 502 may be performed in a manner similar to step 102 as described above, and are not repeated herein. For example, the formation of the dummy gate dielectric (not shown) and the dummy gate (not shown) may comprise similar materials and processes as the gate dielectric 222 and gates 224 as described in FIG. 2, although any material or process suitable to form a dummy gate dielectric or dummy gate may be used.

At step 504, source/drain regions may be formed in the substrate. Step 504 may be performed in a manner similar to step 104 as described above, and thus the details are not repeated herein.

At step 506, a first ESL may be formed over the substrate, the source/drain regions, and the gates and gate spacers. Step 506 may be performed in a manner similar to step 106, and thus the details are not repeated herein.

At step 508, a first ILD is formed over the first ESL. Step 508 may be performed in a manner similar to step 108, and thus the details are not repeated herein.

At step 510, a second ESL is formed over the first ILD. Step 510 may be performed in a manner similar to step 110, and thus the details are not repeated herein.

At step 512, a second ILD is formed over the second ESL layer. Step 512 may be performed in a manner similar to step 112, and thus the details are not repeated herein.

At step 514, the second ILD, the second ESL, the first ILD, and the first ESL may be recessed to expose portions of the dummy gates (not shown). In an embodiment, the semiconductor device 600 is planarized by using a CMP to remove portions of the second ILD 236, the second ESL 234, the first ILD 232, and the first ESL 230 to expose top surfaces of the dummy gates. In other embodiments, other planarization techniques may be used, such as etching. It should be noted that acceptable planarization techniques may use a first process to planarize or etch the second ILD 236 and a second process to planarize or etch the second ESL 234 and further processes to planarized or etch the first ILD and ESL 232 and 230.

At step 516, the dummy gate and dummy gate dielectric are removed. The removal of the dummy gate and the dummy gate dielectric may form an opening over a channel region in the semiconductor substrate 220. The dummy gate and dummy gate dielectric may be removed by an etch that is selective to the material of the dummy gate. For example, if the dummy gate comprises polysilicon, a dry etch using $NF_3$, $SF_6$, $Cl_2$, HBr, the like, or a wet etch using $NH_4OH$, the like, or a combination thereof may be used to remove the dummy gate.

At step 518, a gate dielectric layer and gate is formed in the opening formed by the removal of the dummy gate and dummy gate dielectric. As illustrated in FIG. 6, gate dielectric layer 620 and gate 622 may be formed in the openings formed by the removal of the dummy gate dielectric and the dummy gates. The gate dielectric layer 620 and the gate 622 may be formed of similar materials and by similar processes as gate dielectric layer 222 and gate 224 described in FIG. 2, and are not repeated herein. The semiconductor device 600 may undergo further processing such as formation of contacts to the gates 622 and the source/drain regions 226 as described above in FIG. 2.

It has been found that having a second ESL 234 over the first ILD 232 may prevent recessing of the first ILD 232 between the gates 622 from processing such as the planarizing and etching to expose the top surfaces of the dummy gates. These recesses in the first ILD 232 may allow metal residue from subsequent processing to form between the gates 622 and cause a gate-to-gate bridge. The second ESL 234 prevents these recesses in the first ILD 232 between the gates 622, and thus, may prevent the gate-to-gate bridge. Further, the prevention of metal residue in the first ILD 2332 recesses prevents the necessity of over polishing to remove the metal residue which may cause a shortened gate height.

Figure 7:
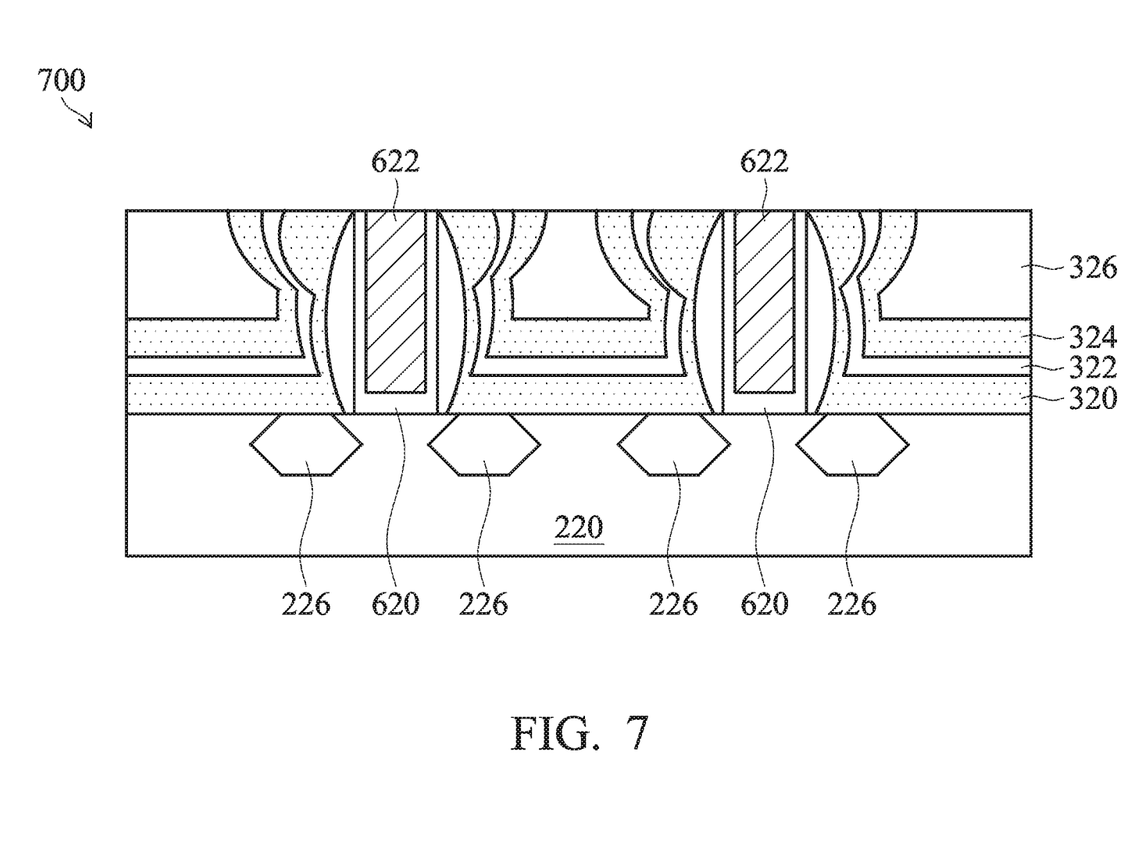
FIG. 7 illustrates a gate-last semiconductor device according to another embodiment.

FIG. 7 illustrates a gate-last semiconductor device 700 with a non-conformal first ESL 320, a non-conformal first ILD 322, a non-conformal second ESL 324, and a second ILD 326. The semiconductor device 700 is similar to semiconductor device 300 in FIG. 3 except for the semiconductor device 700 is formed in a gate-last process rather than the gate-first process of semiconductor device 300. The gate-last process and structure was previously described in FIG. 6. Details regarding this embodiment that are similar to those for the previously described embodiment will not be repeated herein.

Figure 8:
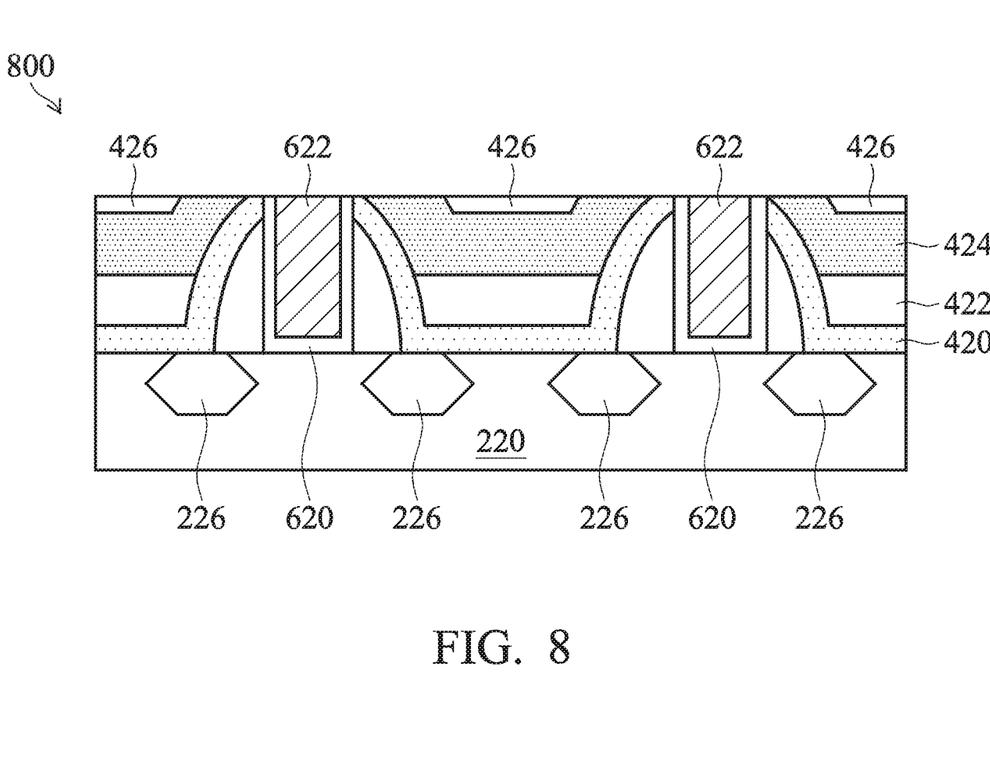
FIG. 8 illustrates a gate-last semiconductor device according to yet another embodiment.

FIG. 8 illustrates a gate-last semiconductor device 800 wherein the first ESL and the first ILD may be formed to have top surfaces which are substantially parallel with the top surface of the semiconductor substrate 220 and wherein the first ESL and the first ILD are not over the gate spacers 228 and the gates 224. The semiconductor device 800 is similar to semiconductor device 400 in FIG. 4 except for the semiconductor device 800 is formed in a gate-last process rather than the gate-first process of semiconductor device 400. The gate-last process and structure was previously described in FIG. 6. Details regarding this embodiment that are similar to those for the previously described embodiment will not be repeated herein.

An embodiment is a semiconductor device comprising a first gate structure over a semiconductor substrate, a first etch stop layer (ESL) over the semiconductor substrate and the first gate, the first ESL having a curved top surface, and a first inter-layer dielectric (ILD) on the first ESL, the first ILD having a curved top surface. The semiconductor device further comprises a second ESL on the first ILD, the second ESL having a curved top surface, and a second ILD on the second ESL.

Another embodiment is a semiconductor device comprising a source region in a semiconductor substrate, a drain region in the semiconductor substrate, the drain region laterally spaced from the source region, a gate over the semiconductor substrate, the gate laterally between the source region and the drain region, and gate spacers on opposite sides of the gate. The semiconductor device further comprises a first etch stop layer (ESL) on the semiconductor substrate, the first ESL adjoining the gate spacers, a first inter-layer dielectric on the first ESL, the first ILD adjoining the gate spacers, a second ESL on the first ILD, the second ESL adjoining the gate spacers and on a top surface of the gate, and a second ILD on the second ESL.

Yet another embodiment is a method of forming a semiconductor device, the method comprising forming a dummy gate dielectric on a semiconductor substrate, forming a dummy gate over the dummy gate dielectric, forming gate spacers on opposite sides of the dummy gate, forming a first etch stop layer (ESL) over the semiconductor substrate and the dummy gate, the first ESL having a curved top surface, and forming a first inter-layer dielectric (ILD) on the first ESL, the first ILD having a curved top surface. The method further comprises forming a second ESL on the first ILD, the second ESL having a curved top surface, forming a second ILD on the second ESL, and replacing the dummy gate and dummy gate dielectric with an active gate and an active gate dielectric.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming a dummy gate dielectric on a semiconductor substrate;
    forming a dummy gate on the dummy gate dielectric;
    forming gate spacers on opposite sides of the dummy gate;
    forming a first etch stop layer (ESL) over the semiconductor substrate and the dummy gate, the first ESL having a curved top surface;
    forming a first inter-layer dielectric (ILD) on the first ESL, the first ILD having a curved top surface;
    forming a second ESL on the first ILD, the second ESL having a curved top surface;
    forming a second ILD on the second ESL; and
    replacing the dummy gate and dummy gate dielectric with an active gate and an active gate dielectric.

2. The method of claim 1, wherein the replacing the dummy gate and the dummy gate dielectric comprises:
    planarizing the second ILD, the second ESL, the first ILD, and the first ESL to expose a top surface of the dummy gate;
    removing the dummy gate;
    removing the dummy gate dielectric to expose a channel region in the semiconductor substrate;
    forming the active gate dielectric on the channel region; and
    forming the active gate on the active gate dielectric.

3. The method of claim 1, wherein the first ESL has a uniform thickness, wherein the first ILD has a uniform thickness, and wherein the second ESL has a uniform thickness.

4. The method of claim 1, wherein the first ESL comprises a first portion on the semiconductor substrate with a top surface substantially parallel with a top surface of the semiconductor substrate, the first portion having a first thickness, a second portion on sidewalls of the gate spacers, the second portion having a second thickness, and a third portion on an upper portion of the gate spacers and the active gate, the third portion having a third thickness.

5. The method of claim 1, wherein the third thickness is greater than the first thickness.

6. The method of claim 4, wherein the first thickness, the second thickness, and the third thickness are substantially equal.

7. The method of claim 1, wherein the forming the first ESL and the forming the second ESL each comprises performing a plasma-enhanced chemical vapor deposition (CVD) process, a low-pressure CVD (LPCVD) process, an atomic layer deposition (ALD) process, a molecular layer deposition (MLD) process, or a combination thereof to form the first ESL, and wherein the forming the first ILD and the second ILD each comprises performing a flowable CVD process, a spin-on-dielectric process, or a combination thereof.

8. The method of claim 1 further comprising:
   forming a source region in the semiconductor substrate; and
   forming a drain region in the semiconductor substrate, the active gate laterally between the source region and the drain region.

9. The method of claim 1, wherein the semiconductor device is a planar transistor or a FinFET.

10. A method comprising:
    forming a first gate stack over a substrate, the first gate stack comprising a first gate electrode over a first gate dielectric;
    forming first gate spacers on opposite sides of the first gate stack;
    forming a source region in the substrate;
    forming a drain region in the substrate, the first gate stack being laterally between the source region and the drain region;
    depositing a first etch stop layer (ESL) on the substrate, the first gate spacers, and the first gate stack;
    depositing a first inter-layer dielectric (ILD) on the first ESL;
    depositing a second ESL on the first ILD, the second ESL having a portion extending below a top surface of the first gate electrode; and
    depositing a second ILD on the second ESL, the second ILD having a portion extending below the top surface of the first gate electrode.

11. The method of claim 10 further comprising:
    replacing the first gate stack with a second gate stack, the second gate stack comprising a second gate electrode and a second gate dielectric.

12. The method of claim 11, wherein replacing the first gate stack with the second gate stack comprises:
    planarizing the second ILD, the second ESL, and the first ESL to expose a top surface of the first gate electrode;
    removing the first gate electrode;
    removing the first gate dielectric to expose a channel region in the substrate;
    forming the second gate dielectric on the channel region; and
    forming the second gate electrode on the second gate dielectric.

13. The method of claim 10, wherein depositing the first ESL is a conformal deposition such that the first ESL has a uniform thickness, wherein depositing the first ILD is a conformal deposition such that the first ILD has a uniform thickness, and wherein depositing the second ESL is a conformal deposition such that the second ESL has a uniform thickness.

14. The method of claim 10, wherein the first ESL comprises a first portion on the substrate having a first thickness, a second portion on sidewalls of the first gate spacers, the second portion having a second thickness, and a third portion on an upper portion of the first gate spacers and the first gate stack, the third portion having a third thickness, wherein the third thickness is greater than the first thickness.

15. The method of claim 10, wherein depositing the first ESL and depositing the second ESL each comprises performing a plasma-enhanced chemical vapor deposition (CVD) process, a low-pressure CVD (LPCVD) process, an atomic layer deposition (ALD) process, or a molecular layer deposition (MLD) process, and wherein depositing the first ILD and the second ILD each comprises performing a flowable CVD process, or a spin-on-dielectric process.

16. The method of claim 10 further comprising:
    forming a third gate structure over the substrate with second gate spacers on opposing sides of the third gate structure, the first ESL adjoining the first gate spacers and the second gate spacers, the first ILD having a substantially planar surface extending from the first ESL on the first gate spacers to the first ESL on the second gate spacers.

17. The method of claim 10, wherein the first ESL and the second ESL have a same material composition.

18. A method comprising:
    forming a dummy gate dielectric on a substrate;
    forming a dummy gate on the dummy gate dielectric;
    forming gate spacers on opposite sides of the dummy gate;
    conformally depositing a first etch stop layer (ESL) over the substrate, the dummy gate, and the gate spacers;
    conformally depositing a first inter-layer dielectric (ILD) on the first ESL;
    conformally depositing a second ESL on the first ILD;
    depositing a second ILD on the second ESL; and
    replacing the dummy gate and dummy gate dielectric with an active gate and an active gate dielectric, wherein the replacing the dummy gate and the dummy gate dielectric comprises:
        planarizing the second ILD, the second ESL, the first ILD, and the first ESL to expose a top surface of the dummy gate.

19. The method of claim 18, wherein the replacing the dummy gate and the dummy gate dielectric comprises:
    after planarizing the second ILD, the second ESL, the first ILD, and the first ESL, removing the dummy gate;
    removing the dummy gate dielectric to expose a channel region in the substrate;
    forming the active gate dielectric on the channel region; and
    forming the active gate on the active gate dielectric.

20. The method of claim 18, wherein after forming the active gate, the second ILD, the second ESL, the first ILD, the first ESL, and the active gate have level top surfaces.

* * * * *